United States Patent [19]
Tsurumi et al.

[11] Patent Number: 6,037,657
[45] Date of Patent: Mar. 14, 2000

[54] CARRIER, SEMICONDUCTOR DEVICE, AND METHOD OF THEIR MOUNTING

[75] Inventors: Koichi Tsurumi, Katano; Kenichi Yamamoto, Moriguchi, both of Japan

[73] Assignee: Matsushita Electric Industrial Co., Ltd., Osaka, Japan

[21] Appl. No.: 08/983,136

[22] PCT Filed: Jul. 18, 1996

[86] PCT No.: PCT/JP96/02007

§ 371 Date: May 19, 1998

§ 102(e) Date: May 19, 1998

[87] PCT Pub. No.: WO97/04481

PCT Pub. Date: Feb. 6, 1997

[30] Foreign Application Priority Data

Jul. 20, 1995 [JP] Japan ................................. 7-184275

[51] Int. Cl.⁷ .................. H01L 23/053; H01L 23/12; H01L 23/48
[52] U.S. Cl. .................. 257/704; 257/701; 257/689
[58] Field of Search ........................ 257/729, 688, 257/689, 701, 704, 711, 731, 732, 733, 668

[56] References Cited

U.S. PATENT DOCUMENTS 4,999,700  3/1991  Dunaway et al. ............... 257/668
5,168,344  12/1992  Ehlert et al. ..................... 257/693
5,841,194  11/1998  Tsukamoto ...................... 257/729

FOREIGN PATENT DOCUMENTS

| 51-46874 | 4/1976 | Japan . |
| 63-3422 | 1/1988 | Japan . |
| 1-226162 | 9/1989 | Japan . |
| 1-291438 | 11/1989 | Japan . |
| 7-231050 | 8/1995 | Japan . |

*Primary Examiner*—Tom Thomas
*Assistant Examiner*—Ori Nadav
*Attorney, Agent, or Firm*—McDermott, Will & Emery

[57] ABSTRACT

A carrier, semiconductor device, and their mounting method which improve reliability such as heat cycle resistance of the semiconductor device mounted on a circuit board. A semiconductor device 1 comprises a carrier for semiconductor 3, and a cavity area is formed at an area of an external electrode 8 of the carrier for semiconductor 3. The external electrode 8 is disposed at the bottom of the concave portion. A solder paste 13 is supplied to the concave portion, the semiconductor device 1 is flipped, and the semiconductor device 1 is mounted on the circuit board 12. The semiconductor 1 mounted on the circuit board 12 is heated to the temperature above the melting point of the solder paste 13.

9 Claims, 8 Drawing Sheets

FIG. 5A
FIG. 5B
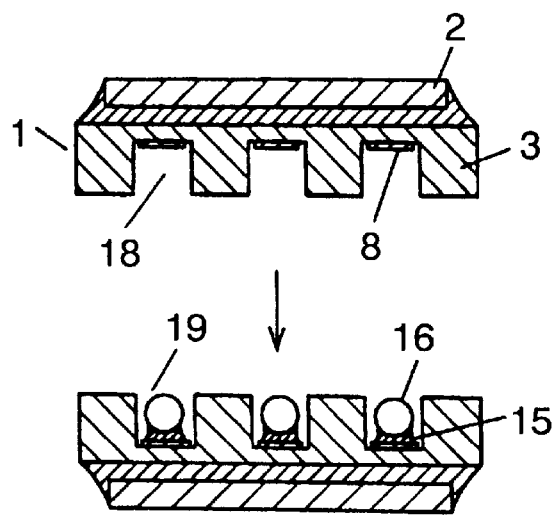
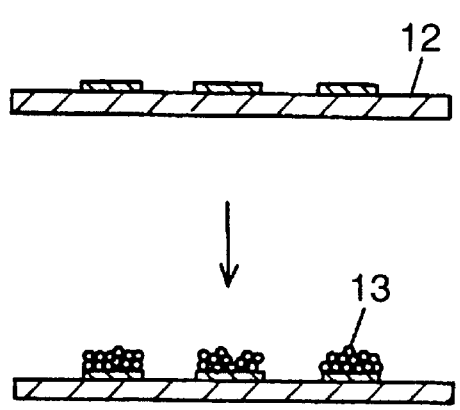
FIG. 5C
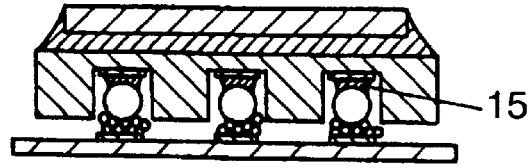
FIG. 5D
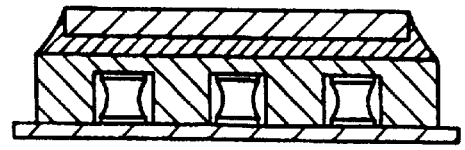

FIG. 6A
FIG. 6B
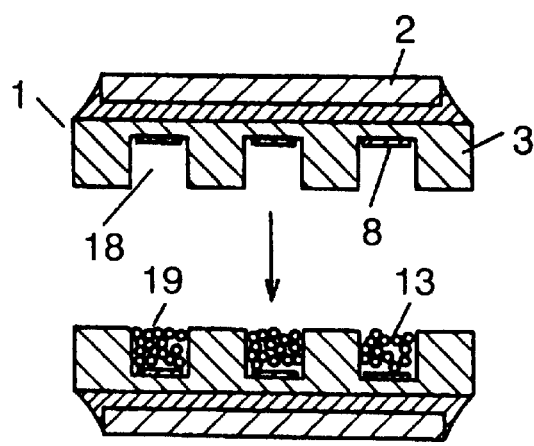
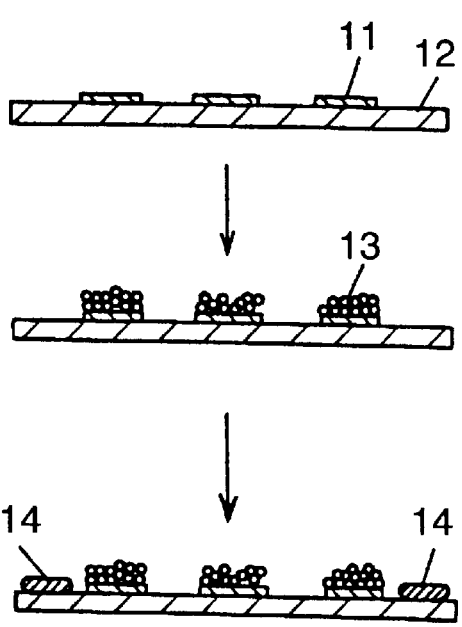
FIG. 6C
FIG. 6D
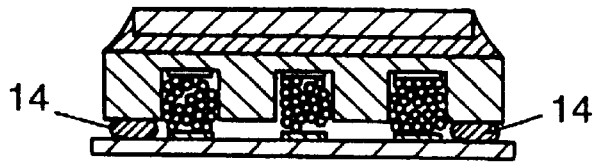
FIG. 6E
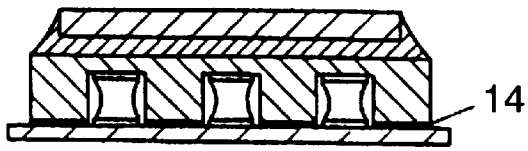

| No. | material | Thermal expansion coefficients (ppm/°C) |
|---|---|---|
| 51 | Glass ceramic | 6.0 |
| 52 | Polyphenylene sulfide | 9.0 |
| 53 | Polyphenylene sulfide | 9.0 |
| 54 | Polyphenylene sulfide | 11.0 |
| 55 | Polyphenylene sulfide | 12.5 |
| 5 | Epoxy resin | 14.0 |

FIG. 7

CARRIER, SEMICONDUCTOR DEVICE, AND METHOD OF THEIR MOUNTING

FIELD OF THE INVENTION

The present invention relates to the field of semiconductor devices for mounting semiconductor elements on circuit boards.

BACKGROUND OF THE INVENTION

A semiconductor device of the prior art is explained with reference to drawings.

In FIG. 8. a semiconductor device 1 consists of a semiconductor element 2 disposed on a carrier 3 made of insulating material. A plurality of electrodes 6 soldered or bonded with a gold bump 5 to electrodes 4 of the semiconductor element 2 are disposed on the top face of the carrier 3, and external electrode terminals 8 are aligned in a matrix on the bottom face of the carrier 3. The electrodes 6 are electrically coupled to external electrode terminals 8. The space between the semiconductor element 2 and carrier 3. and around the semiconductor element 2 are filled and covered with epoxy resin sealant 7. Solder bumps 9 may in some cases be formed on the surface of the external electrode terminals 8. In FIG. 8, the semiconductor device is mounted on a circuit board 12. Electrodes 11 are disposed in the matrix on the circuit board 12 in an area where the semiconductor device 1 will be mounted, corresponding to the external electrode terminals 8. Solder paste 13 is printed on the matrix electrodes 11. As shown in FIG. 9, the semiconductor device 1 is placed on the circuit board 12 so as to allow the external electrode terminals 8 of the semiconductor device 1 to make contact with the electrodes 11 of the circuit board 12. The external electrode terminals 8 and electrodes 11 are bonded with solder 10 by heating and melting the solder paste 13.

The design of the semiconductor device 1 as configured above makes it difficult to adjust the height H between the carrier 3 and circuit board 12, as shown in FIG. 9, when mounting the semiconductor device 1 onto the circuit board 12. If the height H is short, thermal stress generated by the difference in thermal expansion coefficient of the carrier 3 and circuit board 12 is concentrated on the soldered portion, causing cracks in soldered portions or peeling in some cases.

DISCLOSURE OF THE INVENTION

The present invention offers a semiconductor device which can be mounted on a printed circuit board with high reliability, and a mounting method for such semiconductor devices.

In the semiconductor device of the present invention, output electrodes formed on the surface of semiconductor elements which forms an integrated circuit is connected to a conductive circuit formed on a carrier for semiconductor for enabling electrical coupling with an external material using external electrodes formed on the carrier for semiconductor. The external electrodes are disposed on a bottom surface of cavity areas provided in the carrier for semiconductor.

The carrier for semiconductor has a multi-layer structure from the upper part to the lower part protruding to the bottom face, In the thickness direction of the semiconductor device, for forming the concave portion with the upper part of the flat board. Materials used for forming the multi-layer structure has different thermal expansion coefficients which bridge the thermal expansion coefficient of the carrier for semiconductor of the semiconductor device to the circuit board on which the semiconductor device is mounted.

A method for mounting the semiconductor device comprises the dispensing of solder paste to the concave portion of the external electrode of the semiconductor device, flipping of the semiconductor device, mounting of the semiconductor device onto the circuit board, and soldering by heating the circuit board. Another method comprises application of adhesive flux to the concave portion of the external electrode of the semiconductor device, supplying of solder balls on top of the adhesive flux applied, flipping of the semiconductor device, mounting of the semiconductor device onto the circuit board, and soldering by heating the circuit board. Still another method comprises application of adhesive to an area where electrical coupling is not required but the semiconductor device contacts the circuit board when the electrode provided on the concave portion of the semiconductor device and the electrode of the circuit board are electrically coupled, mounting of the semiconductor device onto the circuit board, and soldering by heating the circuit board.

BRIEF DESCRIPTION OF THE DRAWINGS

FIGS. 5A to 5D are a process chart of a mounting method for a semiconductor device in accordance with the second exemplary embodiment of the present invention.

FIGS. 6A to 6E are a process chart of a mounting method is for a semiconductor device in accordance with the third exemplary embodiment of the present invention.

FIG. 7 is a table of thermal expansion coefficients of a material used in a semiconductor device of the exemplary embodiments of the present invention.

DESCRIPTION OF THE PREFERRED EMBODIMENTS

First Exemplary Embodiment

Figure 1A:
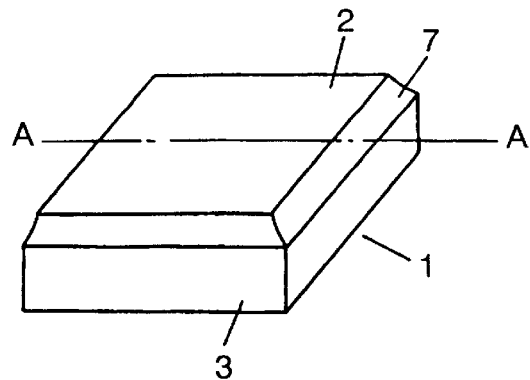
FIG. 1A is a perspective of a semiconductor device with a carrier in accordance with a first exemplary embodiment of the present invention.
Figure 1B:
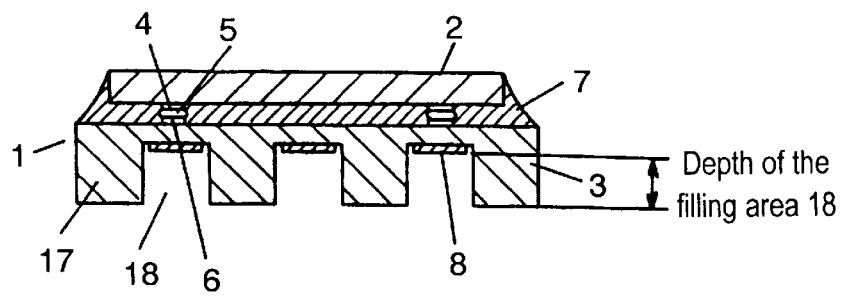
FIG. 1B is a section view seen at A—A of FIG. 1A.
Figure 1C:
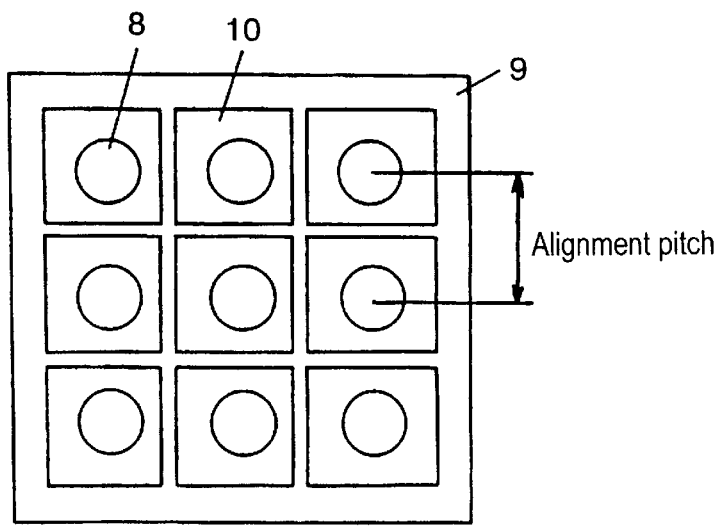
FIG. 1C is a bottom view of FIG. 1A.

FIGS. 1A to 1C show the configuration of a semiconductor device 1 employing a carrier in a first exemplary embodiment of the present invention. A specified circuit is formed in a semiconductor element 2 itself, and an electrode 4 is formed on a part of the semiconductor element 2. A carrier 3 is made of an insulating substrate 17, and the semiconductor element 2 is disposed on the carrier 3. A second electrode 6 is disposed on the top surface (other face) of the carrier 3 which is electrically coupled to the electrode 4 on the semiconductor element 2. An external electrode terminal 8, which is the first electrode, is disposed in the matrix on the bottom surface (one face) of the carrier 3 as shown in FIG. 1C. The external electrode terminal 8 is electrically coupled to the second electrode 6. A filling area 18 is formed on the bottom surface of the carrier (or insulating material 17) in a concave fashion. The filling area 18 will be filled with a bonding material such as solder in a later process. The external electrode terminal 8 is disposed at the bottom of the filling area 18. A sealant 7 fills and covers the space between the semiconductor element 2 and carrier 3, and around the semiconductor element 2. Here, the depth of the filling area is determined based on the desirable height for bonding the semiconductor device 1 or carrier 3 to a board with a specified circuit (hereafter referred to as the "circuit board") in a later process. There is a range of methods for forming the concave filling area 18. For example, a cavity area may be formed by exposure and development using a photosensitive epoxy resin film. The depth of the filling area 18 is preferably 0.2 mm to 1.0 mm if the alignment pitch of the external electrode terminal (i.e., the distance between the center of adjacent external electrode terminals 8) is 1 mm and its diameter (i.e., the diameter of the external electrode terminal 8) is 0.5 mm. The carrier 3 is generally made of alumina and ceramic such as glass ceramic, but it may also be made of resin material such as epoxy resin.

When a semiconductor device as configured above is electrically bonded to a circuit board by means such as soldering, the height H of the bonded portion can be adjusted as required by changing the depth of the filling area 18. This allows the securing of a greater height H between the circuit board and the external electrode terminal 8, compared to the case of mounting a semiconductor device without the filling area onto the circuit board, thereby reducing the stress applied to the bonded face of the external electrode terminal 8 and improving reliability and thermal heat cycle resistance.

The thermal heat cycle resistance here is checked by applying thermal stress to a test piece by repeatedly alternating the ambient temperature surrounding the test piece between high and low. No cracks have been noticed in the soldered portion of the semiconductor device of the present invention after repeating a cycle of +80° C. for 30 minutes and −40° C. for 30 minutes for 1,000 times.

Figure 9:
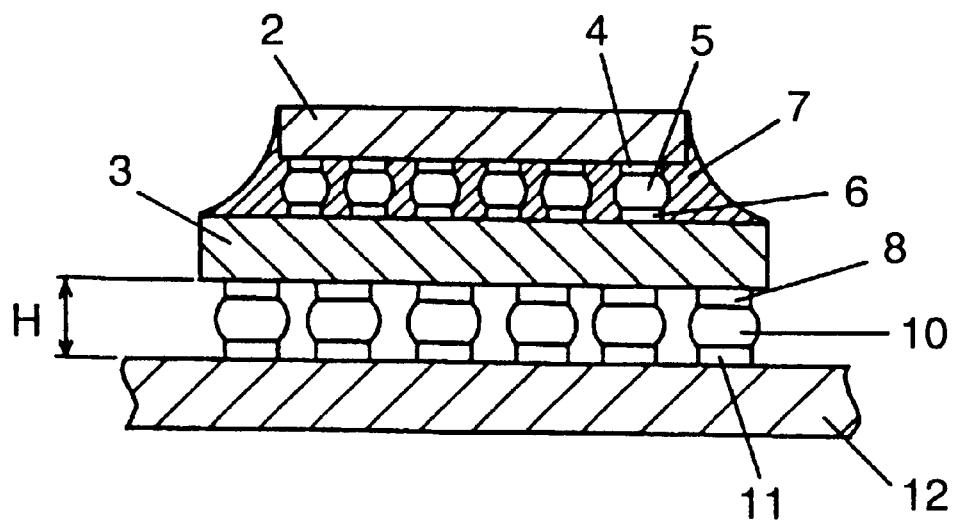
FIG. 9 is a side view of a configuration of a conventional semiconductor device mounted onto a circuit board.

In addition, when the semiconductor device 1 without the filling area 18 is mounted on the circuit board, the solder used for electrical coupling forms a convex drum shape as shown in FIG. 9. With the carrier 3 or the semiconductor device 1 of the present invention, soldering takes place after solder paste or solder balls are provided to the filling area 18, thus enabling the solder to form an hourglass shape with the concave central section in the height direction of bonding. This transfers the stress conventionally focused on the bonded surface to the center part of the bonded portion, allowing improvement of bonding strength and prevention of destruction of the bonded surface.

Second Exemplary Embodiment

Figure 2A:
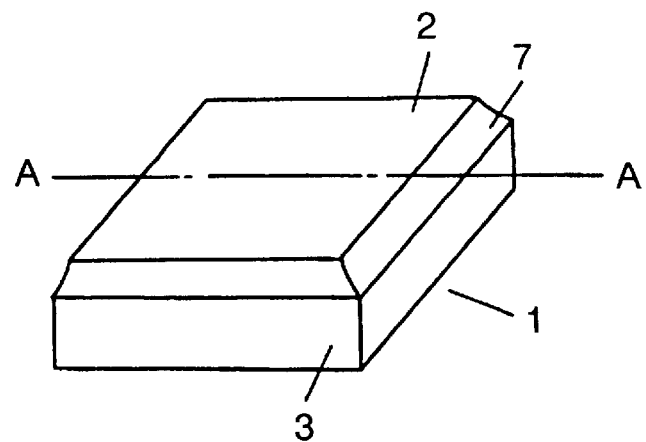
FIG. 2A is a perspective of a semiconductor device with a carrier in accordance with a second exemplary embodiment of the present invention.
Figure 2B:
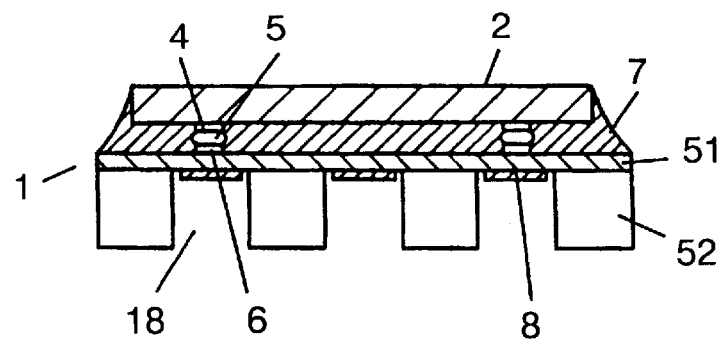
FIG. 2B is a section view seen at A—A of FIG. 2A.
Figure 2C:
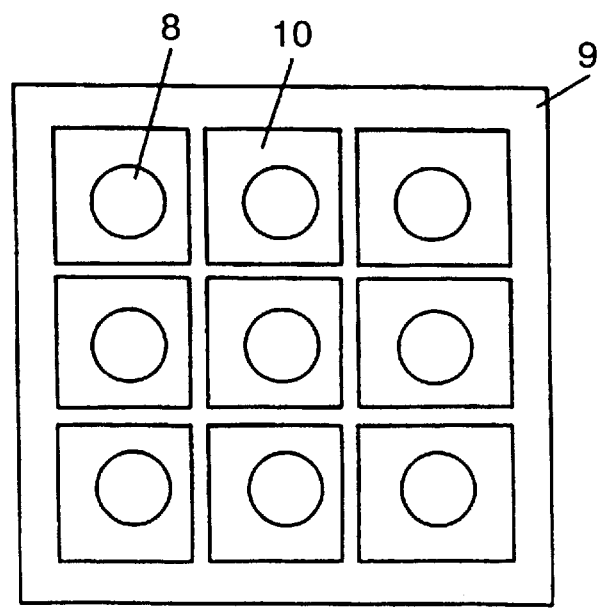
FIG. 2C is a bottom view of FIG. 2A

FIGS. 2A to 2C show a configuration of the semiconductor device 1 with a carrier in a second exemplary embodiment of the present invention. Parts configured identically to the first exemplary embodiment are given the same numeral codes, and thus their explanation is omitted.

The carrier 3 comprises a control material 52 from the bottom face (an insulating material 51 which is a substrate) of the semiconductor device 1 where the filling area 18 (control material 52) is provided (one face) to the bottom surface in the thickness direction of the semiconductor device 1, and a flat insulating material 51 without any concave portion. The external electrode terminal 8, the first electrode, is disposed on the insulating material 51 at the side where the control material 52 is provided. The second electrode 6 is disposed on the insulating material 51 at the side where the control material 52 is not provided (other face). The external electrode terminal 8 and electrode 6 are electrically coupled. The control material 52 is disposed around the external electrode terminal 8, and comprises the external electrode terminal 8 as its bottom, thus forming the filling area 18. The filling area 18 controls the bonding material when applying a bonding material such as solder to the external electrode terminal 8.

The insulating material 51 and the control material 52 in this exemplary embodiment are made of different materials. A material of thermal expansion coefficient closer to that of the semiconductor element 2 than that of the resin is used for the insulating material 51 of the carrier 3. For example, if the semiconductor element 2 employs a silicone substrate, the insulating material 51 may be made of ceramic such as glass ceramic or a mixture of alumina and glass. Alumina may be used for the insulating material 51 and control material 52.

A material of thermal expansion coefficient midway between that of the circuit board on which the semiconductor device 1 is mounted and that of the insulating material 51 is used for the control material 52 of the carrier 3. This will ease the thermal stress between the semiconductor element 2, insulating material 51, control material 52, and the circuit board, and improve the reliability of the structure after applying a bonding material such as solder to the external electrode terminal 8 in a later process. If, for example, the insulating material 51 is made of glass ceramic, a heat-resistant engineering plastic such as polyphenylene sulfide may be used for the control material 52.

The above configuration further reduces the stress applied to the bonded portion in addition to the benefits of the first exemplary embodiment.

Third Exemplary Embodiment

Figure 3A:
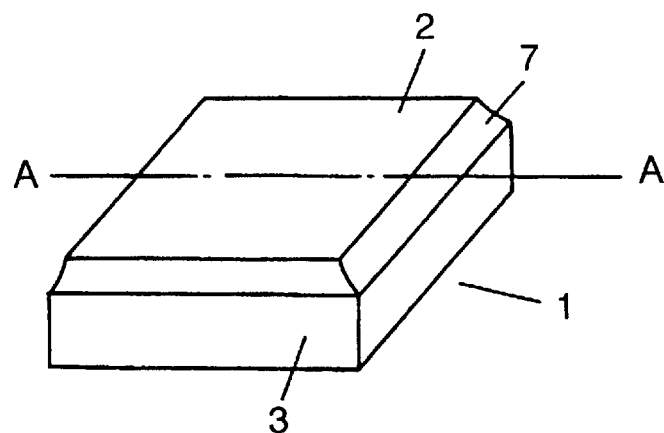
FIG. 3A is a perspective of a semiconductor device with a carrier in accordance with a third exemplary embodiment of the present invention.
Figure 3B:
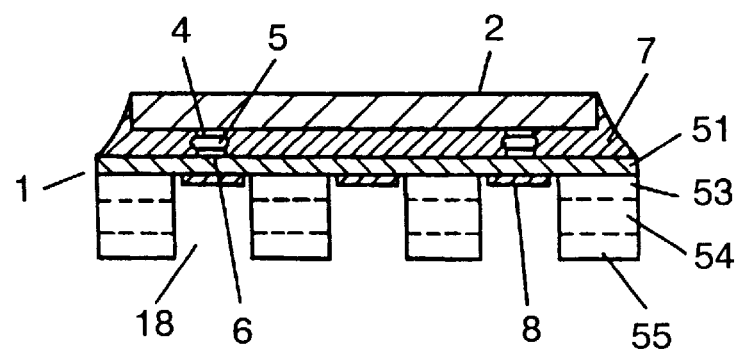
FIG. 3B is a section view seen at A—A of FIG. 3A.
Figure 3C:
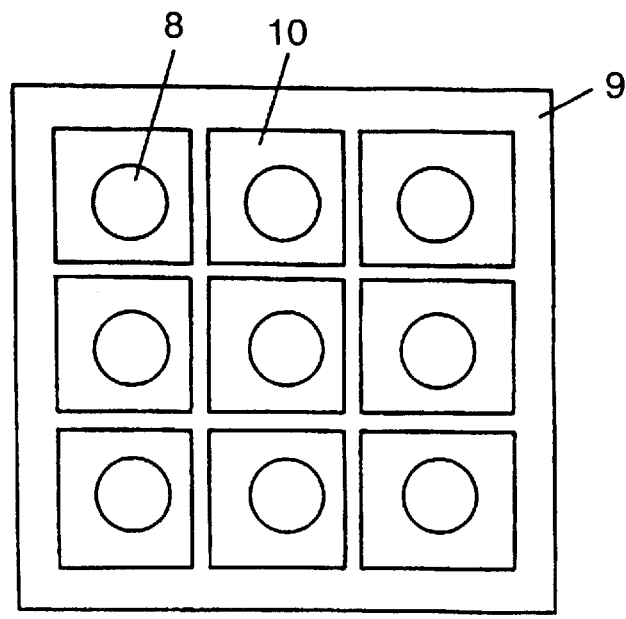
FIG. 3C is a bottom view of FIG. 3A.

FIGS. 3A to 3C show a configuration of a semiconductor device 1 with a carrier in a third exemplary embodiment of the present invention. Parts configured the same as the first exemplary embodiment are given the same numeral codes, and thus their explanation is omitted.

The carrier 3 comprises the control material 52 and insulating material 51 in the same way as in the second exemplary embodiment. The control material 52 consists of several layers 53 to 55 in the thickness direction, made of several materials. The layers in the control material 52 are configured so that their thermal expansion coefficients form a stepwise, positively correlated gradient between the thermal expansion coefficient of the insulating material 51 and that of the circuit board on which the semiconductor device 1 will be mounted in a later process Materials comprising the control material 52 are made of polyphenylene sulfide mixed with filler (e.g., glass fiber), and their thermal expansion coefficient is adjusted by changing the type and volume of the filler. In this exemplary embodiment, the filler consists of about 60% of the entire material in the first layer 53 of the control material 52, about 50% in the second layer 54, and about 40% in the third layer 55. The thermal expansion coefficient increases as the percentage of the filler to the entire volume is reduced. The layers 53, 54, and 55 are bonded with adhesive.

The above configuration enables further reduction of the stress applied to the bonded portion in addition to the benefits achieved by the first exemplary embodiment. The thermal expansion coefficients of the materials used in this exemplary embodiment are shown in FIG. 7.

The thermal expansion coefficient in this exemplary embodiment varies stepwise in the thickness direction from the insulating material 51. However, the same effect can be achieved by linearly varying the thermal expansion coefficient.

Fourth Exemplary Embodiment

A method for mounting the semiconductor device 1 of the present invention onto the circuit board is explained with reference to FIGS. 4A to 4D.

Figure 4A:
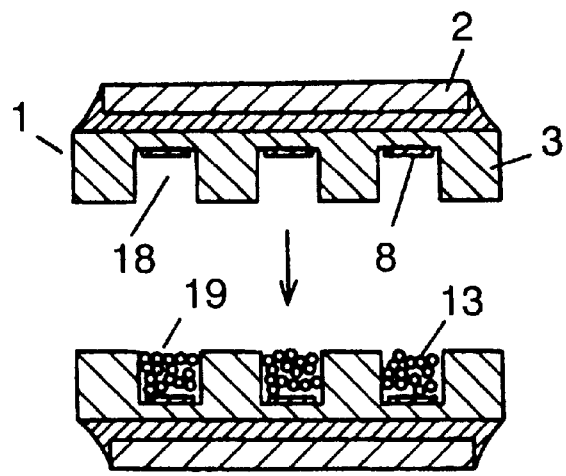
FIGS. 4A to 4D are a process chart of a mounting method for a semiconductor device in accordance with the first exemplary embodiment of the present invention.

First, the semiconductor device 1 is flipped to position the opening 19 in the filling area 18 of the carrier 3 upwards for injecting solder paste 13 (i.e., a pasty mixture of solder powder and flux) into the filling area 18 as shown in FIG. 4A. The solder paste 13 is supplied by using a mask with openings corresponding to the opening 19 of the filling area 18. The mask is placed on the semiconductor device 1 with its openings positioned onto the opening 19, and solder paste 13 is supplied by printing it using a squeegee (i.e., a rubber spatula used for solder printing). The semiconductor device 1 filled with the solder paste 13 is then flipped again to position the filling area 18 of the carrier 3 filled with the solder paste 13 downwards.

Figure 4B:
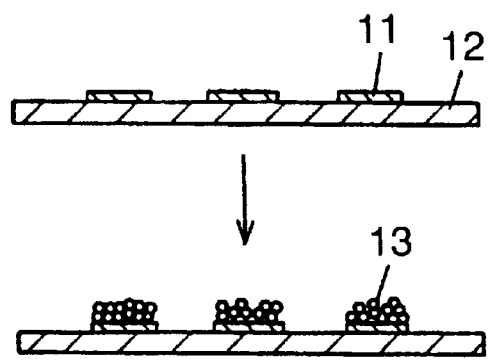

As shown in FIG. 4B, the solder paste 13 is also printed on a circuit board 12 on which the semiconductor device 1 will be mounted, using a mask.

Figure 4C:
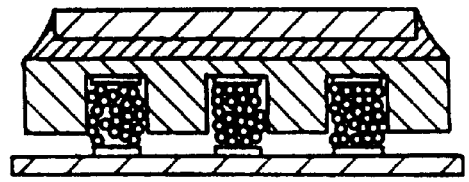
Figure 4D:
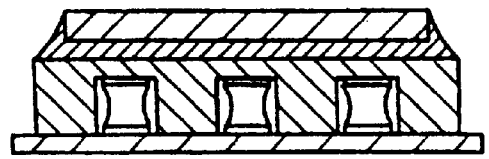
Figure 8:
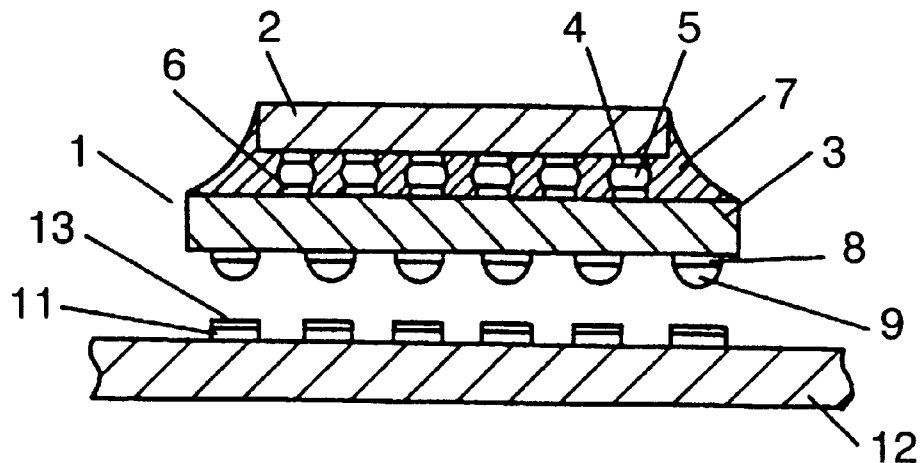
FIG. 8 is a side view of a configuration of a semiconductor device of the prior art.

Next, the semiconductor device 1 is mounted on the circuit board 12 after being positioned as shown in FIG. 4C. During the reflow process (i.e., a soldering method carried out by melting the solder using hot air or heat), the circuit board 12 is heated above the melting point of the solder paste for soldering the external electrode terminal 8 and electrode 11 of the circuit board 12 by melting the solder paste. In general, for eutectic solder, the temperature is increased to 220° C. The volume of solder paste drops approximately by half due to evaporation of the flux in the solder paste during melting. When the semiconductor device 1 and circuit board 12 are cooled to room temperature after soldering, the soldered portion shows an hourglass shape with a concave central section in the bonding height direction as shown in FIG. 4D. Metals also lose about 10% of their volume during solidification.

The solder paste 13 can be supplied into the filling area 18 without using a mask as explained in this exemplary embodiment. For example, the solder paste 13 can be supplied by applying the solder paste 13 directly to the carrier 3 and using the squeegee to remove the excess.

This exemplary embodiment also employs a mask for printing the solder paste 13 on the circuit board 12 because electronic components other than the semiconductor device 1 of the present invention, such as resistors and capacitors, are generally mounted together with the semiconductor device 1. However, since the solder paste 13 is already supplied to the filling area 18 of the carrier 3, printing of the solder paste 13 onto the circuit board 12 may not always be necessary for mounting the semiconductor device 1. Whether to print the solder paste 13 on the circuit board 12 for the semiconductor device 1 depends on whether an opening is provided on the mask or not, and therefore the mounting process itself is always the same.

The mounting method of this exemplary embodiment can be employed for mounting the semiconductor device with carrier in any of the first, second, and third exemplary embodiments.

With the use of this mounting method, the effect described in the first to third exemplary embodiments can be achieved.

Fifth Exemplary Embodiment

Another method for mounting a semiconductor device of the present invention is explained with reference to FIG. 5.

First, the semiconductor device is flipped to position the opening 19 on the filling area 18 disposed on the carrier 3 face upwards, adhesive flux 15 is applied to the external electrode terminal 8, and solder balls 16 are supplied over the adhesive flux 15.

In this exemplary embodiment isopropyl alcohol is used as adhesive flux and solvent, abietic acid as rosin, and ethyl amine hydrochloride as an activator. Other suitable substances, however, may also be utilized.

The adhesive flux 15 is dispensed, and the solder balls 16 are supplied by a mounter placing electronic components. However, other suitable methods may also be utilized. The dispensing means can be, for example, the supply of adhesive flux 15 to a syringe-like container, wherein adhesive flux 15 from a needle tip is extruded to one side by applying pressure to the adhesive flux 15 from the other side.

The semiconductor device 1 supplied with the solder balls 16 is then flipped again to position the filling area of the carrier 3 supplied with the solder balls 16 downwards.

Meanwhile, the solder paste 13 is printed using a mask on the circuit board 12 on which the semiconductor device 1 will be mounted.

Next, the semiconductor device 1 is positioned on the circuit board 12, and mounted. In the reflow process, the solder paste 13 is then melted to solder the external electrode terminal 8 and the electrode 11 of the circuit board 12 by heating it to a temperature above the melting point of the solder paste 13. In general, for eutectic solder, the temperature is increased to 220° C. Since solder paste loses volume when fused, the soldered portion forms an hourglass shape with a concave central section in the height direction when it is cooled down to room temperature after soldering as shown in FIG. 5D.

This exemplary embodiment is applicable for mounting the carrier and semiconductor device described in the first, second, and third exemplary embodiments.

In this exemplary embodiment, the solder paste 13 is printed on the circuit board 12 using the mask, but the process for printing the solder paste 13 on the circuit board 12 is not always necessary for mounting the semiconductor device 1 as in the fourth exemplary embodiment.

With the use of this mounting method, the advantage described in the first to third exemplary embodiments can be achieved.

Sixth Exemplary Embodiment

Still another method for mounting the semiconductor device 1 of the present invention is described with reference to FIG. 6.

First, the semiconductor device 1 is flipped to position the opening 19 on the filling area 18 of the carrier 3 upwards, and the filling area 18 is filled with the solder paste 13 as shown in FIG. 6A.

Adhesive 14 is applied to a contacting area 20 on the circuit board 12 where electrical coupling is not required when the semiconductor 1 contacts the circuit board 12. The adhesive 14 may be applied to the carrier 3 side.

The solder paste 13 is supplied by using a mask with openings corresponding to the opening 19 of the filling area 18. The mask is placed on the semiconductor device 1 with its openings positioned onto the opening 19, and solder paste 13 is supplied by printing it using a squeegee. The semiconductor device 1 filled with the solder paste 13 is then flipped again to position the filling area 18 of the carrier 3 filled with the solder paste 13 downwards. The solder paste 13 is printed on the circuit board 12 on which the semiconductor device 1 will be mounted using a mask as shown in FIG. 6B.

Next, the semiconductor device 1 is positioned on the circuit board 12, and mounted. In the reflow process (i.e. a soldering method carried out by melting the solder using hot air or heat), the solder paste 13 is melted to solder the external electrode terminal 8 and the electrode 11 of the circuit board 12 by heating it to a temperature above the melting point of the solder paste 13. In general, for eutectic solder, the temperature is increased to 220° C. Since solder paste loses volume when fused, the soldered portion forms an hourglass shape with a concave central section in the height direction when it is cooled down to room temperature after soldering as shown in FIG. 6E

Accordingly, the semiconductor device 1 contacts the circuit board 12, and the area not requiring electrical coupling is bonded to the circuit board 12 with adhesive. The adhered area absorbs the stress at heating for soldering, and thus reduces the stress applied to the electrically bonded portion.

The solder paste 13 can be supplied into the filling area 18 without using a mask as explained in this exemplary embodiment. For example, the solder paste 13 can be supplied by applying the solder paste 13 directly to the carrier 3, and using the squeegee to remove the excess.

This exemplary embodiment also employs a mask for printing the solder paste 13 on the circuit board 12 Howeverthe process of printing the solder paste 13 on the circuit board 12 may not always be necessary for mounting the semiconductor device 1, same as in the fourth exemplary embodiment.

With the use of this mounting method, the advantage described in the first to third exemplary embodiments can be achieved.

INDUSTRIAL APPLICABILITY

The carrier or semiconductor device of the present invention allows the control of the height H of a bonded portion by adjusting the depth of the cavity area when electrically coupling, including soldering, to a circuit board. The height H of the bonded portion can be made greater as compared to mounting a semiconductor device without the cavity area, thereby reducing the stress applied to the bonded surface and improving reliability and thermal heat cycle resistance.

In addition, the present invention enables the formation of an hourglass shape with a concave central section in the thickness direction at the soldered portion by filling the filling area with solder paste or solder balls before soldering. In the prior art, a semiconductor device without the filling area forms a convex drum shape at the soldered portion. The soldered portion in the present invention forms an hourglass shape because the volume of solder shrinks when the solder paste melts. The hourglass shape transfers the stress concentrated on the bonded surface to its central section, improving the bonding strength and preventing destruction of the bonded surface.

In the case of electrically coupling the cavity area provided on a carrier for the semiconductor and the electrode on the circuit board, an adhered portion absorbs the stress, reducing the stress applied to the electrically coupled portion, by attaching an area where the semiconductor device and the circuit board contact but electrical coupling is not required with adhesive, and heating and soldering the semiconductor device onto the circuit board.

The present invention also enables the reduction of the stress applied to the adhered portion and thus reduces the stress applied to the electrically coupled portion by forming a part from the electrode at the bottom of the concave portion provided on the carrier for semiconductor of the semiconductor device to the surface of the side where there is no semiconductor element using layers comprising materials with different thermal expansion coefficients which bridge, in a stepwise fashion, the thermal expansion coefficient of the carrier for semiconductor of the semiconductor device to the circuit board on which the semiconductor device is mounted.

What is claimed is:

1. A carrier comprising:

a substrate provided with a cavity area on one face;

a first electrode provided at the bottom of said cavity area of said substrate such that said first electrode occupies only said bottom of said cavity and is completely disposed within said cavity, said cavity operative for receiving a bonding material which is bonded onto said first electrode; and a second electrode provided on the other face of said substrate such that said first electrode and said second electrode are vertically aligned with one another;

said first electrode and said second electrode being electrically coupled through an opening disposed on said bottom.

2. A carrier comprising:

a first electrode provided at one face of a substrate;

a second electrode provided on the other face of said substrate and electrically coupled to said first electrode provided on one face of said substrate through an opening provided at the bottom thereof, said first electrode and said second electrode being vertically aligned with one another;

a control material provided around said first electrode so as to form a filling area, said filling area having said first electrode only at the bottom thereof, said filling area operative for receiving bonding material which is bonded onto said first electrode, said first electrode being completely disposed within said filling area.

3. A carrier according to claim 1, further comprising bonding material disposed within said cavity.

4. A carrier according to claim 2, further comprising bonding material disposed within said filling area.

5. A carrier as defined in claim 2, wherein said substrate and said filling area are made of materials having different thermal expansion coefficients.

6. A carrier as defined in claim 2, wherein a thermal expansion coefficient of said control material at the side of said substrate is close to the thermal expansion coefficient of said substrate, and the thermal expansion coefficient of said control material is graded, in the thickness direction, toward close to the thermal expansion coefficient of a board on which to be mounted.

7. A semiconductor device having electrical coupling among a semiconductor element having a specified circuit and an electrode therein, said electrode of the semiconductor element, and a first electrode of a carrier as defined in one of claims 1 to 6.

8. A carrier comprising:

a substrate provided with a cavity area on one face;

a first electrode provided at the bottom of said cavity area of said substrate such that said first electrode is completely disposed within said cavity, wherein a majority of said cavity is operative for receiving a bonding material which is bonded onto said first electrode; and a second electrode provided on the other face of said substrate such that said first electrode and said second electrode are vertically aligned with one another;

said first electrode and said second electrode being electrically coupled through an opening disposed on said bottom.

9. A carrier comprising:

a first electrode provided at one face of a substrate;

a second electrode provided on the other face of said substrate and electrically coupled to said first electrode provided on one face of said substrate through an opening provided at the bottom thereof, said first electrode and said second electrode being vertically aligned with one another;

a control material provided around said first electrode so as to form a filling area, said filling area having said first electrode at the bottom thereof, a majority of said filling area being operative for receiving bonding material which is bonded onto said first electrode, said first electrode being completely disposed within said filling area.

* * * * *